United States Patent
Tan et al.

(10) Patent No.: US 12,442,104 B2
(45) Date of Patent: Oct. 14, 2025

(54) NANOCRYSTALLINE DIAMOND WITH AMORPHOUS INTERFACIAL LAYER

(71) Applicant: Applied Materials, Inc., Santa Clara, CA (US)

(72) Inventors: Sze Chieh Tan, Singapore (SG); Vicknesh Sahmuganathan, Singapore (SG); Christian W. Valencia, Alhambra, CA (US); Thai Cheng Chua, Cupertino, CA (US); Masahiro Kawasaki, San Jose, CA (US); Jenn-Yue Wang, Santa Clara, CA (US); John Sudijono, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 316 days.

(21) Appl. No.: 18/137,069

(22) Filed: Apr. 20, 2023

(65) Prior Publication Data

US 2024/0352621 A1    Oct. 24, 2024

(51) Int. Cl.
C30B 25/10    (2006.01)
C30B 25/18    (2006.01)
C30B 29/04    (2006.01)

(52) U.S. Cl.
CPC .............. C30B 29/04 (2013.01); C30B 25/10 (2013.01); C30B 25/186 (2013.01)

(58) Field of Classification Search
CPC ....... C30B 29/04; C30B 25/10; C30B 25/186; C23C 16/279; C23C 16/0279
See application file for complete search history.

(56) References Cited

U.S. PATENT DOCUMENTS

| | | | |
|---|---|---|---|
| 5,071,677 A | 12/1991 | Patterson et al. |
| 5,308,661 A | 5/1994 | Feng et al. |
| 5,397,428 A | 3/1995 | Stoner et al. |
| 5,397,558 A | 3/1995 | Miyanaga et al. |
| 5,471,947 A | 12/1995 | Southworth et al. |
| 5,686,152 A | 11/1997 | Johnson et al. |

(Continued)

FOREIGN PATENT DOCUMENTS

| | | |
|---|---|---|
| EP | 0922996 A1 | 6/1999 |
| JP | H04231397 A | 8/1992 |

(Continued)

OTHER PUBLICATIONS

"96 Layers and Beyond: Solving 3D Nand Material and Integration Challenges", Entegris Pure Advantage, 10 pgs.

(Continued)

*Primary Examiner* — Robert M Kunemund
(74) *Attorney, Agent, or Firm* — SERVILLA WHITNEY LLC

(57) ABSTRACT

Methods of depositing a nanocrystalline diamond film are described. The method may be used in the manufacture of integrated circuits. Methods include treating a substrate with a plasma to form a treated substrate surface, incubating the treated substrate with a carbon-rich plasma to nucleate diamond particles on the treated substrate surface, followed by treating the substrate with a plasma to form a nanocrystalline diamond film. The resulting nanocrystalline diamond films are formed on an interfacial oxide-rich amorphous layer between the nanocrystalline diamond film and a silicon substrate.

17 Claims, 2 Drawing Sheets

(56) References Cited

U.S. PATENT DOCUMENTS

| | | |
|---|---|---|
| 5,712,724 A | 1/1998 | Klocek et al. |
| 5,849,079 A | 12/1998 | Gruen et al. |
| 5,942,204 A | 8/1999 | Dunmead et al. |
| 6,440,640 B1 | 8/2002 | Yang et al. |
| 6,482,262 B1 | 11/2002 | Elers et al. |
| 6,487,986 B1 | 12/2002 | Liehr et al. |
| 6,576,404 B2 | 6/2003 | Hu et al. |
| 6,950,176 B1 | 9/2005 | Lafontaine et al. |
| 7,033,739 B2 | 4/2006 | Goldstein et al. |
| 7,079,740 B2 | 7/2006 | Vandroux et al. |
| 7,306,674 B2 | 12/2007 | Dahl et al. |
| 7,309,476 B2 | 12/2007 | Carlson et al. |
| 7,611,751 B2 | 11/2009 | Elers |
| 7,666,474 B2 | 2/2010 | Li et al. |
| 7,745,328 B2 | 6/2010 | Yim et al. |
| 7,795,468 B2 | 9/2010 | Liu et al. |
| 7,947,372 B2 | 5/2011 | Dekempeneer |
| 8,105,660 B2 | 1/2012 | Tudhope et al. |
| 8,354,290 B2 | 1/2013 | Sumant et al. |
| 8,420,768 B2 | 4/2013 | Dahl |
| 8,748,322 B1 | 6/2014 | Fung et al. |
| 9,502,262 B2 | 11/2016 | Chen et al. |
| 9,624,577 B2 | 4/2017 | Manna et al. |
| 9,837,284 B2 | 12/2017 | Chen et al. |
| 9,881,805 B2 | 1/2018 | Li et al. |
| 9,887,096 B2 | 2/2018 | Park |
| 9,911,582 B2 | 3/2018 | Wu et al. |
| 9,991,118 B2 | 6/2018 | Kwon et al. |
| 10,658,180 B1 | 5/2020 | Mignot et al. |
| 10,745,282 B2 | 8/2020 | Venkatasubramanian et al. |
| 11,594,416 B2 | 2/2023 | Sahmuganathan et al. |
| 11,946,134 B2* | 4/2024 | Tan ............... C23C 16/0227 |
| 2001/0009695 A1 | 7/2001 | Saanila et al. |
| 2002/0159944 A1 | 10/2002 | Smalley et al. |
| 2003/0128810 A1 | 7/2003 | Verman et al. |
| 2004/0214113 A1 | 10/2004 | Goldstein et al. |
| 2004/0258918 A1 | 12/2004 | Chaffin, III |
| 2005/0031785 A1 | 2/2005 | Carlisle et al. |
| 2005/0260411 A1 | 11/2005 | Ravi |
| 2006/0093972 A1 | 5/2006 | Goldstein et al. |
| 2006/0153994 A1 | 7/2006 | Gicquel et al. |
| 2006/0245058 A1 | 11/2006 | Van Herpen et al. |
| 2007/0251446 A1 | 11/2007 | Dahl et al. |
| 2007/0259524 A1 | 11/2007 | Lee et al. |
| 2008/0017992 A1 | 1/2008 | Kito et al. |
| 2008/0020248 A1 | 1/2008 | Sridhar et al. |
| 2008/0076850 A1 | 3/2008 | Asano |
| 2008/0166887 A1 | 7/2008 | Lee et al. |
| 2009/0022969 A1* | 1/2009 | Zhang ............... C23C 30/005 |
| | | 428/216 |
| 2009/0029067 A1 | 1/2009 | Sciamanna et al. |
| 2009/0176035 A1 | 7/2009 | Tudhope et al. |
| 2010/0048757 A1 | 2/2010 | Okada et al. |
| 2010/0084634 A1 | 4/2010 | Gamo et al. |
| 2010/0112214 A1 | 5/2010 | Dahl et al. |
| 2010/0242834 A1 | 9/2010 | Bhandari |
| 2010/0271610 A1 | 10/2010 | Soer et al. |
| 2010/0327412 A1 | 12/2010 | Lee et al. |
| 2011/0079918 A1 | 4/2011 | Zhou et al. |
| 2011/0162674 A1 | 7/2011 | Tang et al. |
| 2011/0256347 A1 | 10/2011 | Manuad et al. |
| 2012/0188522 A1 | 7/2012 | Silova |
| 2013/0059440 A1 | 3/2013 | Wang et al. |
| 2013/0244430 A1 | 9/2013 | Lin |
| 2013/0260157 A1 | 10/2013 | Lee et al. |
| 2014/0017889 A1 | 1/2014 | Lee et al. |
| 2014/0048804 A1 | 2/2014 | Cheng et al. |
| 2014/0054534 A1 | 2/2014 | Pellizzer et al. |
| 2014/0110373 A1 | 4/2014 | Nishimura et al. |
| 2014/0131586 A1 | 5/2014 | Wang et al. |
| 2014/0131883 A1 | 5/2014 | Huang et al. |
| 2014/0213059 A1 | 7/2014 | Doan et al. |
| 2015/0037712 A1 | 2/2015 | Shih et al. |
| 2015/0099123 A1 | 4/2015 | Barbee et al. |
| 2015/0126042 A1 | 5/2015 | Pasquale |
| 2015/0315707 A1 | 11/2015 | Xue et al. |
| 2015/0318181 A1 | 11/2015 | Cantone et al. |
| 2016/0011502 A1 | 1/2016 | Hofmann et al. |
| 2016/0012929 A1 | 1/2016 | Kuznetsov et al. |
| 2016/0053366 A1 | 2/2016 | Stowell et al. |
| 2016/0218012 A1 | 7/2016 | Shimamoto et al. |
| 2016/0225633 A1 | 8/2016 | Kim et al. |
| 2016/0307767 A1 | 10/2016 | Lee et al. |
| 2016/0307803 A1 | 10/2016 | Mun et al. |
| 2017/0003419 A1 | 1/2017 | Jaiswal et al. |
| 2017/0062216 A1 | 3/2017 | Chen et al. |
| 2017/0229325 A1 | 8/2017 | Lubomirsky et al. |
| 2017/0372960 A1 | 12/2017 | Mebarki et al. |
| 2018/0127871 A1 | 5/2018 | Khan et al. |
| 2018/0354804 A1 | 12/2018 | Venkatasubramanian et al. |
| 2019/0096748 A1 | 3/2019 | Kuo et al. |
| 2019/0127846 A1 | 5/2019 | Tudhope et al. |
| 2020/0124972 A1 | 4/2020 | Thompson et al. |

FOREIGN PATENT DOCUMENTS

| | | |
|---|---|---|
| JP | H0624896 A | 2/1994 |
| JP | H07069792 A | 3/1995 |
| JP | H11246974 A | 9/1999 |
| JP | 2006250767 A | 9/2006 |
| JP | 2008078470 A | 4/2008 |
| JP | 2008085062 A | 4/2008 |
| JP | 2010533122 A | 10/2010 |
| JP | 2012512801 A | 6/2012 |
| JP | 2017055118 A | 3/2017 |
| JP | 2017533580 A | 11/2017 |
| JP | 2017534750 A | 11/2017 |
| JP | 6259915 B2 | 1/2018 |
| KR | 19980017982 A | 6/1998 |
| KR | 20020048610 A | 6/2002 |
| KR | 20080085280 A | 9/2008 |
| KR | 20120121340 A | 11/2012 |
| WO | 9533864 A1 | 12/1995 |
| WO | 2005011902 A1 | 2/2005 |
| WO | 2007034808 A1 | 3/2007 |
| WO | 2007111967 A2 | 10/2007 |
| WO | 2008026395 A1 | 3/2008 |
| WO | 2010022839 A2 | 3/2010 |
| WO | 2012084570 A1 | 6/2012 |
| WO | 2016036533 A1 | 3/2016 |
| WO | 2018118085 A1 | 6/2018 |
| WO | 2020092885 A1 | 5/2020 |
| WO | 2022132879 A1 | 6/2022 |

OTHER PUBLICATIONS

"Chapter 12: Extreme Ultraviolet Lithography", Downloaded from the internet: <https://www.spiedigitallibrary.org/ebooks/> on Sep. 19, 2019, 425-458.

PCT International Search Report and Written Opinion in PCT/US2019/040931 dated Oct. 25, 2019, 12 pages.

PCT International Search Report and Written Opinion in PCT/US2019/044618 dated Nov. 18, 2019, 12 pages.

PCT International Search Report and Written Opinion in PCT/US2020/055924 dated Feb. 3, 2021, 11 pages.

PCT International Search Report and Written Opinion in PCT/US2021/046095 dated Dec. 6, 2021, 11 pages.

PCT International Search Report and Written Opinion in PCT/US2021/055732 dated Feb. 8, 2022, 12 pages.

PCT International Search Report and Written Opinion in PCT/US2021/063483 dated Apr. 12, 2022, 11 pages.

PCT International Search Report and Written Opinion in PCT/US2022/051880 dated Apr. 25, 2023, 8 pages.

PCT International Search Report and Written Opinion in PCT/US2023/060958 dated May 19, 2023, 9 pages.

Arnault, Jean-Charles, et al., "Surface Science Contribution to the BEN Control on Si(100) and 3C-SIC(100): Towards Ultrathin Nanocrystalline Diamond Films", Chem. Vap. Deposition 2008, 14, 187-195.

Bruno, P., et al., "Deposition of nanocrystalline diamond films on silicon nitride ceramic substrates using pulsed microwave dis-

(56) References Cited

OTHER PUBLICATIONS charges in Ar/H2/CH4 gas mixture", Diamond & Related Materials 14 (2005) 432-436.
Bruno, P., et al., "Improvement of nanocrystalline diamond film growth process using pulsed Ar/H2/CH4 microwave discharges", J. Phys. D: Appl. Phys. 37 (2004) L35-L39.
Chen, Y. C., et al., "Chemical vapor deposition of diamond on silicon substrates coated with adamantane in glycol chemical solutions", RSC advances, 2013, vol. 3, No. 5, pp. 1514-1518.
Choi, Won Seok, et al., "Characterization of diamond-like carbon thin films prepared by a microwave plasma enhanced chemical vapor deposition method", Surface and Coatings Technology 180-181 (2004) 254-258.
Choi, Kwang-Woo, et al., "Effect of photo-acid generator concentration and developer strength on the patterning capabilities of a model EUV photoresist", Proc. of SPIE vol. 6519 651943-1: 651943-9.
Cicala, Grazia, et al., "Load sensitive super-hardness of nanocrystalline diamond coatings", Diamond & Related Materials 101 (2020) 107653, 8 pages.
Cicala, G., et al., "Study of polycrystalline diamond deposition by continuous and pulsed discharges", Surface & Coatings Technology 204 (2010) 1884-1888.
De Silva, Anuja, et al., "Inorganic hardmask development for EUV patterning", Proc. of SPIE vol. 10583 105830V-1: 105830V-15.
Fendrych, Frantisek, et al., "Growth and characterization of nanodiamond layers prepared using the plasma- enhanced linear antennas microwave CVD system", J. Phys. D: Appl. Phys. 43 (2010) 374018 (6pp).
Frgala, Z., "Microwave PECVD of nanocrystalline diamond with rf induced bias nucleation", Czechoslovak Journal of Physics, vol. 56 (2006), Suppl. B.
Grigonis, Marius, et al., "C/Si multilayer mirrors for the 25-30-nm wavelength region", Applied Optics, vol. 36, No. 13, (1997), pp. 2839-2842.
Jiang, X., et al., "Nucleation and initial growth phase of diamond thin films on (100) silicon", The American Physical Society, vol. 50, No. 12.
Kang, Shuhui, et al., "Characterization of the photoacid diffusion length", Proc. of SPIE vol. 7273 72733U-1: 72733U-11.
Kim, Jung Sik, et al., "Evaluation of optical properties of EUV resist underlayer", Proc. of SPIE vol. 9422 94222E1-94222E7.
Kim, Sang-Kon, "Modeling and Simulation of Line Edge Roughness for EUV Resists", Journal of Semiconductor Technology and Science, vol. 14, No. 1, Feb. 2014, 61-69.
Kromka, A., et al., "Linear antenna microwave plasma CVD deposition of diamond films over large areas", Vacuum 86 (2012) 776-779.
Kumar, Shyam, et al., "Growth of Diamond by MPCVD Process", Proceedings of the DAE Symp. on Nucl. Phys. 58 (2013).
Leroy, Eric, et al., "Chemical vapor deposition of diamond growth using a chemical precursor", Applied Physics Letters 73, 1050 (1998), 4 pages.
Lio, Anna, "EUV resists: What's next?", Proc. of SPIE vol. 9776 97760V-1: 97760V-14.
Liu, Cong, et al., "Growth of micro- and nanocrystalline dual layer composite diamond films by microwave plasma CVD: Influence of C02 concentration on growth of nano-layer", Journal of Crystal Growth 410 (2015) 30-34.
Maillard-Schaller, E., et al., "Local heteroepitaxy of diamond on silicon (100): A study of the interface structure" The American Physical Society, vol. 55, No. 23.
Maloney, Christopher W., et al., "Longer wavelength EUV lithography (LW-EUVL)", Proc. of SPIE vol. 8322 83222Z-1: 83222Z-7.
Mandal, Soumen, et al., "Chemical Nucleation of Diamond Films", ACS Appl. Mater. Interfaces, Just Accepted Manuscript, Sep. 2016, <downloaded from the web: http://pubs.acs.org> Sep. 17, 2016, 21 pages.

Monéger, D., et al., "Deposition of nanocrystalline diamond films in pulsed Ar/H2/CH4 microwave discharges", Diamond & Related Materials 16 (2007) 1295-1299.
Popov, C., et al., "Influence of the nucleation density on the structure and mechanical properties of ultrananocrystalline diamond films", Diamond & Related Materials 18 (2009) 151-154.
Raghunathan, Sudharshanan, et al., "Experimental measurements of telecentricity errors in high-numerical-aperture extreme ultraviolet mask images", Journal of Vacuum Science & Technology B 32, 06F801 (2014), 9 pages.
Ravet, M. F., et al., "B/Si multilayers for soft x-ray and extreme ultraviolet optics", Journal of Applied Physics 89, 1145 (2001), 7 pages.
Ree, Brian J., et al., "Nanoscale film morphology and property characteristics of dielectric polymers bearing monomeric and dimeric adamantane units", Polymer 169 (2019) 225-233.
Spohn, Matthias, et al., "Poly(1-vinyladamantane) as a Template for Nanodiamond Synthesis", ACS Appl. Nano Mater. 2018, 1, 6073-6080.
Sternschulte, H., et al., "Comparison of MWPCVD diamond growth at low and highprocess gas pressures", Diamond and Related Materials, vol. 15, Issues 4-8, Apr.-Aug. 2006, pp. 542-547.
Stoner, B. R., et al., "Characterization of bias-enhanced nucleation of diamond on silicon by in vacuo surface analysis and transmission electron microscopy", The American Physical Society, vol. 45, No. 19.
Stowers, Jason K., et al., "Directly patterned inorganic hardmask for EUV lithography", Proc. of SPIE vol. 7969 796915-1: 796915-11.
Sultane, Prakash R., et al., "Stereoelectronically Directed Photodegradation of Poly(adamantyl Vinyl Ketone)", Macrorol. Rapid Commun. 2019, 1900302.
Taylor, Andrew, et al., "Effect of plasma composition on nanocrystalline diamond layers deposited by a microwave linear antenna plasma-enhanced chemical vapour deposition system", Phys. Status Solidi A 212, No. 11, 2418-2423 (2015).
Taylor, Andrew, et al., "Large area deposition of boron doped nano-crystalline diamond films at low temperatures using microwave plasma enhanced chemical vapour deposition with linear antenna delivery", Diamond & Related Materials 47 (2014) 27-34.
Taylor, Andrew, et al., "Novel high frequency pulsed MW-linear antenna plasma-chemistry: Routes towards large area, low pressure nanodiamond growth", Diamond & Related Materials 20 (2011) 613-615.
Thackeray, James W., et al., "EUV Resists based on Low Acid Diffusion", 2009 International Symposium on Extreme Ultraviolet Lithography, Oct. 19, 2009, 31 pages.
Tiwari, Rajanish N., et al., "Enhanced Nucleation and Growth of Diamond Film on Si by CVD Using a Chemical Precursor", J. Phys. Chem. C 2011, 115, 16063-16073.
Tsugawa, K., et al., "Nucleation Enhancement of Nanocrystalline Diamond Growth at Low Substrate Temperatures by Adamantane Seeding", J. Phys. Chem. C 2010, 114, 3822-3824.
Uspenskii, Yu. A., et al., "Determination of the optical constants of amorphous carbon in the EUV spectral region 40-450 eV", Proc. of SPIE vol. 6317 631713-1 : 631713-5.
Wang, Kemin, et al., "Photopolymerization of 1-Adamantyl Acrylate Pohotoinitiated by Free Radical Photoinitiators", Journal of Applied Polymer Science, vol. 123, 26-31 (2012).
Williams, O. A., et al., "High Young's modulus in ultra thin nanocrystalline diamond", Chemical Physics Letters 495 (2010) 84-89.
Williams, O. A., "Nanocrystalline diamond", Diamond & Related Materials 20 (2011) 621-640.
Windt, David L., et al., "Experimental comparison of extreme-ultraviolet multilayers for solar physics", Mar. 20, 2004, Applied Optics, vol. 43, Issue 9, pp. 1835-1848.
Wood, Obert, et al., "Improved Ru/Si multilayer reflective coatings for advanced extreme ultraviolet lithography photomasks", BACUS News, Jun. 2016, vol. 32, Issue 6, 11 pages.
Yang, Woo Seok, "Effects of secondary pretreatments of substrate on the nucleation of diamond film", Journal of Materials Research, vol. 11, No. 7, Jul. 1996.

(56) References Cited

OTHER PUBLICATIONS

Yi, Qiang, et al., "Structural and EUV performance of Si/C multilayers deposited under different working pressure", Optical Interference Coatings (OIC) 2016, 3 pages.
Zeng, Hongjun, et al., "Boron-doped ultrananocrystalline diamond synthesized with an H-rich/Ar-lean gas system", Carbon 84 (2014) 103-117.
Zhuravel, I. O., et al., "Structural Transformation in C/Si Multilayer after Annealing", National Technical University "KhPI" (Kharkiv) Ukraine, (2012), vol. 10, No. 3.
Machine Translation of KR 19980017982, 5 pages.
PCT International Search Report and Written Opinion in PCT/US2024/025453 dated Aug. 14, 2024, 11 pages.
Chen, et al., "Microstructural evolution of diamond/Si(100) interfaces with pretreatments in chemical vapor deposition", J. Mater. Res., vol. 10, No. 12, Dec. 1995.
Huang, et al., "The surface properties on both sides of the isolated diamond film", Materials Science and Engineering B64 (1999) 187-191.
Karasawa, et al., "Diamond Crystal Grovvth on Silicon and its Interfacial Characterization", Surface and Coatings Technology, 43/44 (1990) 41-52.
Robertson, et al., "Mechanism of bias-enhanced nucleation of diamond on Si", Appl. Phys. Lett. 66, 3287 (1995); https://doi.org/10.1063/1.113732.
Werninghaus, et al., "Diamond Layers on Silicon: Feasibility of Interface Assessment by Infrared and Raman Spectroscopies", phys. stat. sol. (a) 154, 269 (1996).
Williams, et al., "Characterization of diamond thin films: Diamond phase identification, surface morphology, and defect structures", J. Mater. Res., vol. 4, No. 2, Mar./Apr. 1989.

\* cited by examiner

NANOCRYSTALLINE DIAMOND WITH AMORPHOUS INTERFACIAL LAYER

TECHNICAL FIELD

Embodiments of the present disclosure pertain to the field of electronic device manufacturing, and, in particular, to integrated circuit (IC) manufacturing. More particularly, embodiments of the disclosure provide methods of depositing diamond-like carbon hard mask films on amorphous interfacial layers. Film stacks comprising diamond-like carbon directly on an amorphous layer which is directly on a substrate are also disclosed.

BACKGROUND

As the semiconductor industry introduces new generations of integrated circuits (ICs) having higher performance and greater functionality, the density of the elements that form those ICs is increased, while the dimensions, size, and spacing between the individual components or elements are reduced. While in the past, such reductions were limited only by the ability to define the structures using photolithography, device geometries having dimensions measured in μm or nm have created new limiting factors such as the conductivity of the metallic elements, the dielectric constant of the insulating material(s) used between the elements, or challenges in 3D-NAND or DRAM processes. These limitations may be addressed by more durable and higher hardness hard masks.

Diamond is a material with high hardness, chemical inertness, high thermal conductivity, and good optical transparency, making it promising in microelectronic applications. Diamond has emerged as a promising candidate for a myriad of microelectronic applications.

The large discrepancy in the surface energies of diamond and silicon (6 J cm$^{-2}$ vs. 1.5 J cm$^{-2}$), low sticking coefficients of the gaseous precursors (e.g., hydrocarbon radicals) and strong competition from the nondiamond phases, however, typically result in poor diamond nucleation density (~10$^4$ cm$^{-2}$) on untreated silicon.

To address poor diamond nucleation density, the substrate is usually pre-treated (e.g., mechanical abrasion or micro-chipping) and/or seeded with nano-diamond (ND) particles prior to deposition. Such seeding methods, however, consist of multiple solution-based procedures which are cumbersome and not cleanroom compatible.

Alternatively, Bias-enhanced nucleation (BEN) is one of the few nucleation techniques that can be performed in-situ. It involves the bombardment of methane-rich (4-10%) ionized gas species on the surface of a negatively-charged biased substrate, allowing the formation of a carbide layer with improved substrate adhesion. With BEN, nucleation densities greater than 10$^{11}$ cm$^{-2}$ had been reported. Unfortunately, the application of BEN is limited by the presence of substrate surface damages (e.g., in the form of holes as deep as 2-3 μm in diameter), difficulty in applying bias uniformly over large areas, and the need for a conductive substrate.

For both seeding technologies and BEN, several researchers have reported the presence of a carbon-rich interfacial layer between the nano-crystalline diamond (NCD) film and the substrate. A working theory was that such carbon-rich interfacial layer is crucial to the subsequent formation of diamond nuclei. While the role of SiC in diamond nucleation is not yet understood, it is generally agreed that such interfacial layer consists mainly of silicon and carbon with minimal oxygen (<10$^{19}$ cm$^{-3}$ or 0.1 atomic percent).

Oxides, particularly silicon oxides are far better understood and more widely used than silicon carbides. Accordingly, there is a need for methods of forming the nanocrystalline diamond (NCD) films on oxygen-containing materials.

SUMMARY

One or more embodiments of the disclosure are directed to a method of forming a nanocrystalline diamond film. The method comprises exposing a silicon substrate to a first plasma from a first plasma source. The first plasma source comprising one or more of $C_xH_y$ wherein y≥x, carbon dioxide ($CO_2$), hydrogen ($H_2$), nitrogen ($N_2$), and argon (Ar) to provide a treated substrate. The treated substrate is incubated with a gas stream comprising a hydrocarbon and a second plasma to nucleate diamond particles and form a seeded substrate. The seeded substrate is exposed to a third plasma having a power greater than 50 W to form a nanocrystalline diamond film. After formation of the nanocrystalline diamond film, the nanocrystalline diamond film is directly on an oxide-rich amorphous layer which is directly on the silicon substrate.

Additional embodiments of the disclosure are directed to a method of forming a diamond film. The method comprises exposing a treated substrate to a gas stream comprising a hydrocarbon to nucleate diamond particles on a top surface of the substrate. The substrate comprises an exposed amorphous oxide-rich layer. The diamond particles are exposed to a plasma having a power greater than 50 W to form a nanocrystalline diamond film on the top surface of the substrate, which is not silicon.

Further embodiments of the disclosure are directed to an electronic device comprising: a silicon substrate, an amorphous oxide layer directly on the silicon substrate, and a nanocrystalline diamond film directly on the amorphous oxide layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
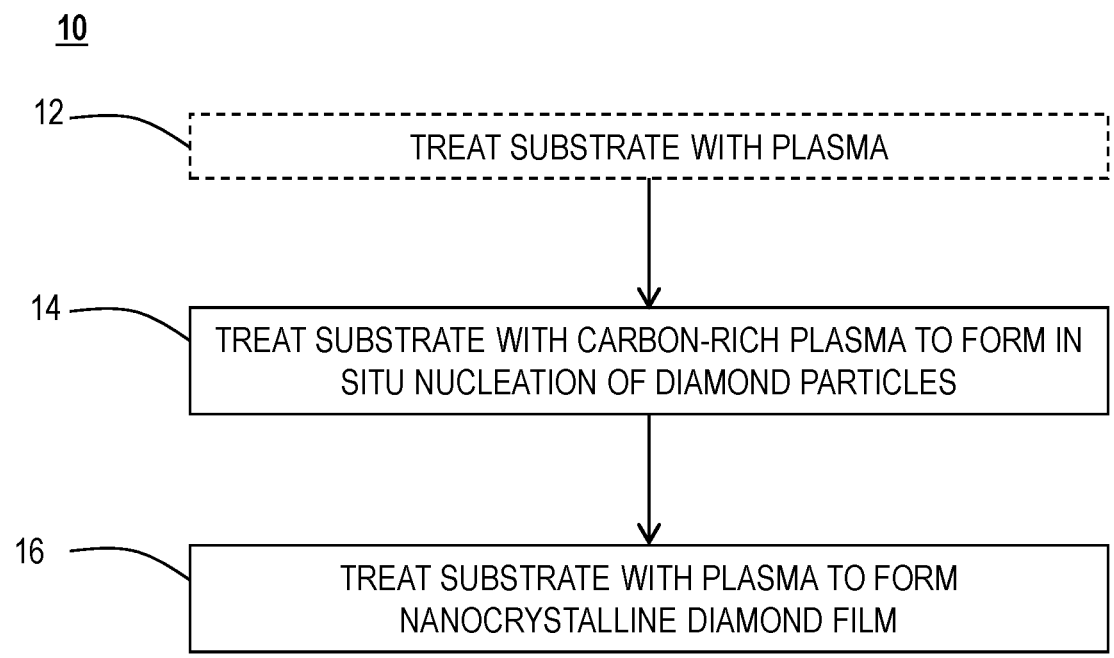
FIG. 1 illustrates a process flow diagram of a method for depositing a nanocrystalline diamond film according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the terms "precursor," "reactant," "reactive gas" and the like are used interchangeably to refer to any gaseous species that can react with the substrate surface.

The term "about" as used herein means approximately or nearly and in the context of a numerical value or range set forth means a variation of ±15% or less, of the numerical value. For example, a value differing by ±14%, ±10%, ±5%, ±2%, ±1%, ±0.5%, or ±0.1% would satisfy the definition of "about."

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface before, during or after the disclosed methods.

The substrate may be any substrate capable of having material deposited thereon, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like.

In some embodiments, the substrate comprises a dielectric. In some embodiments, the substrate comprises or consists essentially of silicon. In some embodiments, the substrate comprises or consists essentially of silicon oxide, silicon nitride or silicon carbide. In some embodiments, the substrate is not a silicon substrate. In some embodiments, the substrate is substantially free of any native oxides before being processed according to the disclosed methods. As used in this regard, as substrate which is "substantially free of any native oxide" contains less than 2 percent oxygen atoms of the surface atoms of the substrate material. In some embodiments, the substrate is cleaned of surface oxides before being processed by the disclosed methods.

In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

As used in this disclosure and the appended claims, the term "on", with respect to a film or a layer of a film, includes the film or layer being directly on a surface, for example, a substrate surface, as well as there being one or more underlayers between the film or layer and the surface, for example the substrate surface. Thus, in some embodiments, the phrase "on the substrate surface" is intended to include one or more underlayers. In other embodiments, the phrase "directly on" refers to a layer or a film that is in contact with a surface, for example, a substrate surface, with no intervening layers. Thus, the phrase "a layer directly on the substrate surface" refers to a layer in direct contact with the substrate surface with no layers in between.

As used herein, the phrase "nanocrystalline diamond" refers a solid film of diamond grown on a substrate (e.g., silicon). In one or more embodiments, nanocrystallinity is the result of the enhanced re-nucleation reaction in diamond growth, where the growth of diamond crystal is disrupted due to the fluctuation of surrounding environments such as the amounts of radical species, temperature, and pressure. In one or more embodiments, nanocrystalline diamond layers are mainly comprised of small diamond crystals in nanospheres, or a nanocolumnar shape, and amorphous carbon distributed usually distributed in the positions between surrounding crystals or accumulate in the grain boundaries. Nanocrystalline diamond is used as a hard mask material in semiconductor applications because of its chemical inertness, optical transparency, and good mechanical properties.

One or more embodiments of the disclosure advantageously provide a novel method for the in situ nucleation and growth of nanocrystalline diamond films. Embodiments describe the development and utilization of plasma and gas chemistry for substrate treatment and the nucleation and growth of nanocrystalline diamond films. In one or more embodiments, prior solution-based substrate treatment/cleaning nor additional seeding methods such as sonication with nanodiamonds or mechanical scratching are not used. Likewise, no unique chemicals are required during the process.

Some embodiments of the disclosure advantageously provide a method of forming a nanocrystalline diamond film on an oxide-rich amorphous interfacial layer. Without being bound by theory, the inventors have found that the oxide-rich interfacial layer stands in contrast to previously reported interfacial layers which are essentially SiC. Further, it is believed that the presence of an oxide interfacial layer provides a divergent understanding of the growth mechanics of NCD films and may enable growth on previously unreported substrate materials.

In one or more embodiments, a nanocrystalline diamond layer is formed on a substrate. The process of one or more embodiments advantageously produces a nanocrystalline diamond layer with high density, high hardness, high etch selectivity, low stress, and excellent thermal conductivity.

Hard masks are used as etch stop layers in semiconductor processing. Ashable hard masks have a chemical composition that allows them to be removed by a technique referred to as ashing once they have served their purpose. An ashable hard mask is generally composed of carbon and hydrogen with trace amounts of one or more additional elements (e.g., nitrogen, fluorine, boron, silicon).

In a typical application, after etching, the hard mask has served its purpose and is removed from the underlying layer. This is generally accomplished, at least in part, by ashing, also referred to as "plasma ashing" or "dry stripping." Substrates with hard masks to be ashed, generally partially fabricated semiconductor wafers, are placed into a chamber under vacuum, and oxygen is introduced and subjected to radio frequency power, which creates oxygen radicals and ions (i.e., oxygen plasma). The plasma reacts with the hard mask to oxidize it to water, carbon monoxide, and carbon dioxide. In some instances, complete removal of the hard mask may be accomplished by following the ashing with additional wet or dry etching processes, for example when the ashable hard mask leaves behind any residue that cannot be removed by ashing alone.

Hard mask layers are often used in narrow and/or deep contact etch applications, where photoresist may not be thick enough to mask the underlying layer. This is especially applicable as the critical dimension shrinks.

V-NAND, or 3D-NAND, structures are used in flash memory applications. V-NAND devices are vertically stacked NAND structures with a large number of cells arranged in blocks. As used herein, the term "3D-NAND" refers to a type of electronic (solid-state) non-volatile computer storage memory in which the memory cells are stacked in multiple layers. 3D-NAND memory generally includes a plurality of memory cells that include floating-gate transistors. Traditionally, 3D-NAND memory cells include a plurality of NAND memory structures arranged in three dimensions around a bit line.

An important step in 3D-NAND technology is slit etch. As the number of tiers increases in each technology node, to control the slit etch profile, the thickness of the hard mask film has to proportionally increase to withstand high aspect etch profiles. Currently, amorphous carbon (aC:H) films are used due to high hardness and ease of removal after the slit etch. However, amorphous carbon hard mask films have delamination concerns and poor morphology, leading to pillar striations.

One or more embodiments of the disclosure are described with reference to the Figures. FIG. 1 illustrates a process flow diagram of a method 10 according to one or more embodiments. FIGS. 2A through 2E illustrate schematic cross-sectional view of a substrate 102 being processed according to the method 10 of one or more embodiments.

Figure 2A:
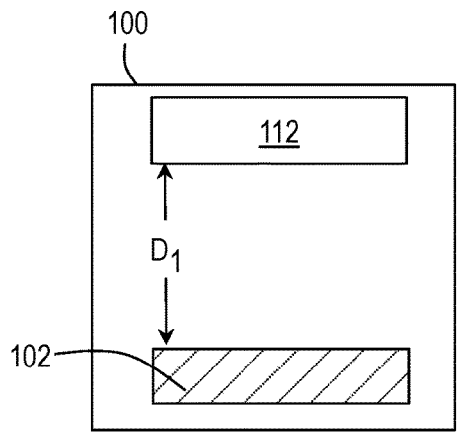
FIGS. 2A-2E illustrate a schematic cross-sectional view of a substrate within a processing chamber during processing according to one or more embodiments of the disclosure.
Figure 2B:
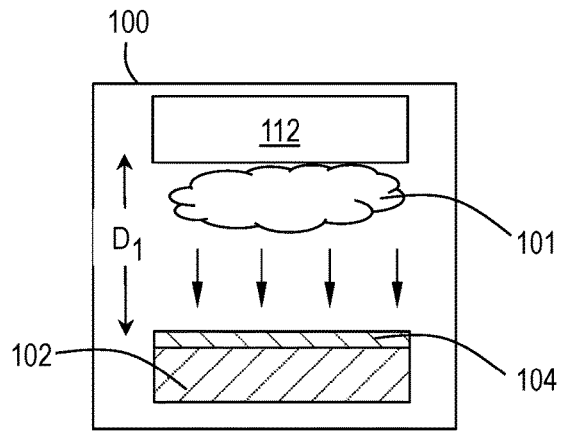

Referring to FIGS. 1 and 2A-2B, a method 10 of forming a nanocrystalline fully coalesced diamond film 120 is described. In some embodiments, the method 10 comprises, at operation 12, treating a substrate 102 with a first plasma 101 from a first plasma source 112 to form a treated substrate 104. The substrate 102 surface is exposed to a first plasma 101 in the first plasma process chamber 100 for a first plasma time period $T_{P1}$ to form treated substrate 104.

The first plasma process chamber 100 can be any suitable plasma chamber with any suitable plasma source, such as, but not limited to, remote, microwave, capacitively coupled plasma (CCP), or inductively coupled plasma (ICP). In some embodiments, flow rates and other processing parameters described below are for a 300 mm substrate. It should be understood these parameters can be adjusted based on the size of the substrate processed and the type of chamber used without diverging from the methods disclosed herein. In specific embodiments, the first plasma 101 comprises one or more of a capacitively coupled plasma, inductively coupled plasma, pulsed discharge plasma, microwave plasma, hot filament, or electron cyclotron resonance plasma.

In some embodiments, the first plasma 101 comprises one or more of an organic species having the empirical formula $C_xH_y$, where y≥x, argon (Ar), nitrogen gas ($N_2$), carbon dioxide ($CO_2$), or hydrogen gas ($H_2$).

In some embodiments, the first plasma 101 is generated with a power greater than or equal to about 50 watts, greater than or equal to about 100 watts, or greater than or equal to about 150 watts. In one or more embodiments, the plasma treatment may occur at any suitable power. In one or more embodiments, the power is greater than or equal to about 50 W. In other embodiments, the power is in a range of from about 50 W to about 12 kW, or in a range of from about 100 W to about 10 kW, or in a range of from about 100 W to about 5 kW, or in a range of from about 100 W to about 1 kW.

In some embodiments, the substrate 102 is maintained at a temperature in the range of from about 20° C. to about 600° C. during formation of the treated substrate 104.

In some embodiments, forming the treated substrate 104 comprises at least one cycle of exposure to the first plasma 101. In some embodiments, forming the treated substrate 104 comprises in the range of 1 to about 1000 cycles of exposures to the first plasma 101.

The first plasma process chamber 100 of some embodiments comprises a first plasma source 112, which may include one or more of a showerhead, electrodes, resonators, linear antenna, and the like. In one or more embodiments, the first plasma source 112 is positioned at a first distance $D_1$ from the top surface of the substrate 102. In some embodiments, the first distance, $D_1$, is greater than or equal to 10 mm, 15 mm, 20 mm, or 25 mm.

While not shown in the Figures, in some embodiments, operation 12 forms an oxide-rich amorphous layer directly on the substrate 102. Stated differently, in some embodiments, the treated substrate 104 comprises an oxide-rich amorphous layer. At this point of method 10, the oxide-rich amorphous layer comprises about 50 to about 70 atomic percent of oxygen. In some embodiments, the oxide-rich amorphous layer comprises about 5 to about 75, about 10 to about 75, about 20 to about 70, about 35 to about 70 or about 50 to about 70 atomic percent oxygen. At this point of the method 10, the oxide-rich amorphous layer has a thickness of less than or equal to about 5 nm, less than or equal to about 10 nm, less than or equal to about 20 nm, or less than or equal to about 50 nm.

Figure 2C:
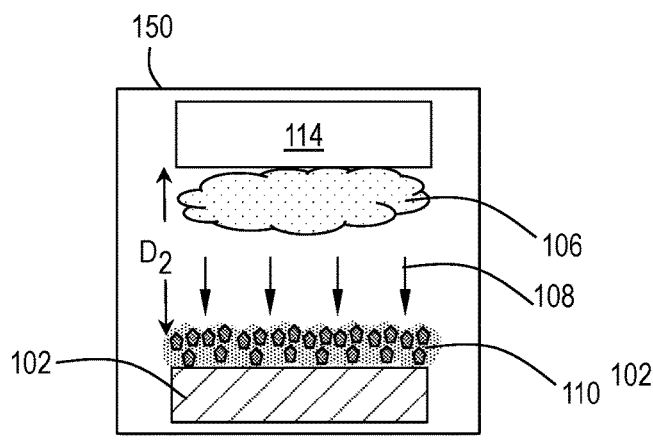
Figure 2D:
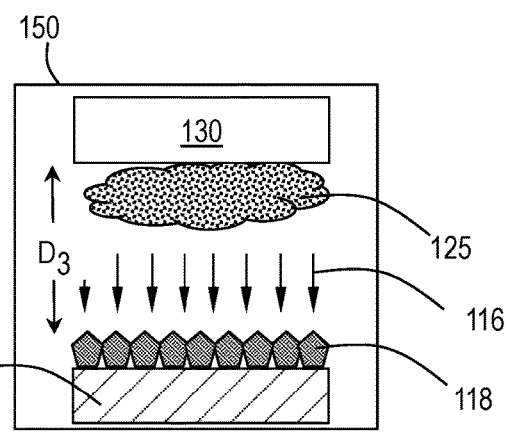

Referring to FIG. 1 and FIG. 2C, at operation 14, the treated substrate 104 is incubated with a carbon-rich gas stream 108 and a second plasma 106 to nucleate diamond particles forming a diamond nuclei layer 110 on the top surface of the substrate 102. In some embodiments, the diamond nuclei layer 110 on the substrate 102 (or the treated substrate 104) is referred to as the seeded substrate.

In one or more embodiments, the diamond nuclei layer 110 is formed in a second plasma process chamber 150 with a second plasma 106 generated by a second plasma source 114. In other embodiments, not shown, the diamond nuclei layer 110 is formed in the first plasma process chamber 100 with a second plasma 106 generate by first plasma source 112. In some embodiments, the second plasma 106 can be generated by the first plasma source 112 but using different gases (compositions).

The second plasma process chamber 150 and the first plasma process chamber 100 can be any suitable plasma chamber with any suitable plasma source, such as, but not limited to, remote, microwave, capacitively coupled plasma (CCP), or inductively coupled plasma (ICP). In some embodiments, flow rates and other processing parameters described below are for a 300 mm substrate. It should be understood these parameters can be adjusted based on the size of the substrate processed and the type of chamber used without diverging from the embodiments disclosed herein. In specific embodiments, the second plasma 106 comprises one or more of a capacitively coupled plasma, inductively coupled plasma, pulsed discharge plasma, microwave plasma, hot filament, or electron cyclotron resonance plasma.

In some embodiments, the gas stream 108 (and the resulting second plasma 106) comprises a hydrocarbon. In one or more embodiments, the hydrocarbon has a general formula of $C_mH_n$, where m is in a range from 1 to 120, and n is in a range of from 2 to 242. In specific embodiments, the hydrocarbon is selected from one or more of methane ($CH_4$), ethane ($C_2H_6$), propane ($C_3H_8$), butane ($C_4H_{10}$), pentane ($C_5H_{12}$), hexane ($C_6H_{14}$), heptane ($C_7H_{16}$), ethene ($C_2H_4$), propene ($C_3H_6$), butene ($C_4H_8$), pentene ($C_5H_{10}$), hexene ($C_6H_{12}$), heptane ($C_7H_{14}$), ethyne ($C_2H_2$), propyne ($C_3H_4$), butyne ($C_4H_6$), pentyne ($C_5H_8$), hexyne ($C_6H_{10}$), and heptyne ($C_7H_{12}$).

In one or more embodiments, the second plasma 106 may include, in addition to the hydrocarbon, one or more of argon (Ar), nitrogen gas ($N_2$), carbon dioxide ($CO_2$), or hydrogen gas ($H_2$). In one or more embodiments, the gas stream 108 comprising the hydrocarbon is co-flowed with one or more of argon (Ar), nitrogen gas ($N_2$), carbon dioxide ($CO_2$), or hydrogen gas ($H_2$) during plasma generation. In one or more embodiments, the gas stream 108 comprises from 5% to 90% hydrocarbon.

In some embodiments, the second plasma 106 is generated with a power less than or equal to about 15 kilowatts (kW), less than or equal to about 12 kW, less than or equal to about 10 kW, less than or equal to about 8 kW, less than or equal to about 6 kW, less than or equal to about 5 kW, or less than or equal to about 4 kW. In some embodiments, the gas stream 108 is ignited at a power of less than or equal to about 12 kW to form the second plasma 106. In some embodiments, the second plasma 106 is a pulsed plasma with a duty cycle less than or equal to 90%, less than or equal to 70%, less than or equal to 65%, less than or equal to 60%, less than or equal to 55%, less than or equal to 50%, less than or equal to 45% or less than or equal to 40% at a frequency in the range of about 20 Hz to about 5000 Hz, in the range of about 60 Hz to about 90 Hz, or in the range of about 70 Hz to about 80 Hz. In some embodiments, the second plasma 106 has a power less than or equal to about 6 kW with a duty cycle less than or equal to 50% at a frequency in the range of about 70 Hz to about 80 Hz. In some embodiments, the substrate 102 (or treated substrate 104) is maintained at a temperature in the range of about 50° C. to about 600° C. during formation of the diamond nuclei layer 110.

In some embodiments, the substrate 102 (or treated substrate 104) is incubated with the gas stream 108 and the second plasma 106 for a time period in a range of 1 second to about 10 hours. In some embodiments, the substrate 102 (or treated substrate 104) is incubated with the gas stream 108 and the second plasma 106 for a time period of less than or equal to about 4 hours, less than or equal to about 3 hours, less than or equal to about 2 hours, or less than or equal to about 1 hour.

In some embodiments, the substrate 102 (or treated substrate 104) is positioned at a second distance $D_2$ from first plasma source 112 or second plasma source 114. In some embodiments, the substrate 102 (or treated substrate 104) is positioned at a second distance $D_2$ less than or equal to about 12 cm, less than or equal to about 10 cm, or less than or equal to about 8 cm from the first plasma source 112 or from the second plasma source 114. In some embodiments, the second distance is greater than or equal to 1 cm. In some embodiments, the first plasma source 112 or from the second plasma source 114 comprises a showerhead which acts as an electrode. In some embodiments, the second plasma source 114 comprises a microwave plasma source.

While not shown in the Figures, in some embodiments, operation 14 forms the oxide-rich amorphous layer directly on the substrate surface. Alternatively, in some embodiments, the oxide-rich amorphous layer formed by operation 12 is still present after operation 14. Regardless of when it is formed, it can be stated differently that, in some embodiments, the seeded substrate comprises an oxide-rich amorphous layer. Further, the oxide-rich amorphous layer is directly on the substrate 102, between the diamond nuclei layer 110 and the substrate 102. At this point of method 10, the oxide-rich amorphous layer comprises at least 5 atomic percent or at least 20 atomic percent of oxygen. At this point of the method 10, the oxide-rich amorphous layer has a thickness of less than or equal to about 50 nm, less than or equal to about 20 nm, less than or equal to about 10 nm, less than or equal to about 5 nm, or less than or equal to about 3 nm.

At operation 16, a nanocrystalline diamond film 118 is grown from the diamond nuclei layer 110. As used in this manner, the term "grown" means that the nanocrystalline diamond film 118 is formed from the diamond nuclei layer 110 and may incorporate the diamond nuclei layer 110 into the nanocrystalline diamond film 118. The nanocrystalline diamond film 118 can be epitaxially grown or deposited by any suitable technique known to the skilled artisan.

In some embodiments, growing the nanocrystalline diamond film 118 occurs in the second plasma process chamber 150 using a third plasma 125. In other embodiments, growing the nanocrystalline diamond film 118 occurs in the first plasma process chamber 100 using a third plasma 125. Thus, in one or more embodiments, the first plasma process chamber 100 and the second plasma process chamber 150 are the same chamber. In some embodiments, the nanocrystalline diamond film 118 is grown using a conductively or inductively coupled plasma, microwave plasma, pulsed discharge plasma, microwave plasma, hot filament, or electron cyclotron resonance plasma. In some embodiments, the nanocrystalline diamond film 118 is grown using a microwave plasma.

In some embodiments, the third plasma 125 comprises a microwave plasma having a power greater than or equal to about 50 W, greater than or equal to about 100 W, greater than or equal to about 500 W, greater than or equal to about 1000 W (1 kW), greater than or equal to about 3 kW, or greater than or equal to about 5 kW with a duty cycle greater than or equal to about 60%, greater than or equal to about 70%, or greater than or equal to about 80%.

In some embodiments, the substrate 102 is maintained at a temperature in the range of about 25° C. to about 750° C. during exposure to the third plasma 125. In some embodiments, the substrate 102 is maintained at a temperature greater than or equal to about 25° C., greater than or equal to about 50° C., greater than or equal to about 75° C., greater than or equal to about 100° C., greater than or equal to about 150° C., greater than or equal to about 200° C., or greater than or equal to about 250° C. during exposure to the third plasma 125.

During operation 16, the substrate 102 is positioned a distance $D_3$ from the third plasma source 130. In some embodiments, the third plasma 125 can be generated by the first plasma source 112 and/or the second plasma source 114 but using different gases (compositions) or by a different third plasma source 130. In some embodiments, the distance $D_3$ is the same as the distance $D_2$. In some embodiments, the third distance $D_3$ is less than the second distance $D_2$. In some embodiments, the substrate 102 is positioned at a distance from the third plasma source 130, or from the first plasma source 112, or from the second plasma source 114, of less than or equal to about 12 cm, less than or equal to about 10 cm, or less than or equal to about 8 cm.

Figure 2E:
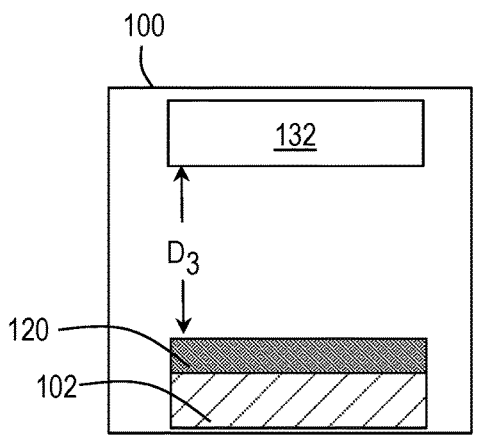

With reference to FIG. 2E, in one or more embodiments, after being subjected to an extended period of main growth, the high nucleation density on the seeded substrate leads to the formation of a fully coalesced nanocrystalline diamond film 120. In one or more embodiments, FIG. 2E illustrates how the fully coalesced nanocrystalline diamond film 120 looks after method 10 is complete. The difference between nanocrystalline diamond film 118 and fully coalesced nanocrystalline diamond film 120 is that in the nanocrystalline diamond film 118, the diamond nuclei from diamond nuclei layer 110 grow in size to become individual, larger diamond particles. These larger diamond particles are, however, isolated from each other. As these large diamond particles continue to grow in size, they eventually come into contact with the neighboring particles and begin to merge/coalesce with each other. This forms a dense, packed nanocrystalline diamond film, which becomes the fully coalesced nanocrystalline diamond film 120.

While not shown in the Figures, in some embodiments, operation 16 forms the oxide-rich amorphous layer directly on the substrate surface. Alternatively, in some embodiments, the oxide-rich amorphous layer formed by operation 12 or operation 14 is still present after operation 16. Regardless of when it is formed, it can be stated differently that, in some embodiments, the substrate comprises an oxide-rich amorphous layer. Further, the oxide-rich amorphous layer is directly on the substrate 102, between the full coalesced nanocrystalline diamond film 120 and the substrate 102. At this point of method 10, the oxide-rich amorphous layer comprises at least 5 atomic percent, at least 10 atomic percent, at least 20 atomic percent, or at least 30 atomic percent of oxygen. At this point of the method 10, the oxide-rich amorphous layer has a thickness of less than or equal to about 50 nm, less than or equal to about 20 nm, or less than or equal to about 10 nm.

One or more embodiments of the disclosure relate to an electronic device comprising a nanocrystalline diamond film. The nanocrystalline diamond film is directly on an interfacial oxide-rich amorphous layer, the oxide-rich amorphous layer is directly on a silicon substrate. In some embodiments, the electronic device is formed by the methods disclosed herein.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a nanocrystalline diamond film, the method comprising:
   exposing a silicon substrate to a first plasma from a first plasma source, the first plasma source comprising one or more of $C_xH_y$, wherein y≥x, carbon dioxide ($CO_2$), hydrogen ($H_2$), nitrogen ($N_2$), and argon (Ar) to provide an oxide rich amorphous interfacial layer directly on the icon substrate;
   incubating the oxide-rich amorphoius interfacial layer directly on the silicon substrate with a gas stream and a second plasma to nucleate diamond particles and form a seeded substrate, the gas stream comprising a hydrocarbon; and
   exposing the seeded substrate to a third plasma having a power greater than 50 W to form a nanocrystalline diamond film directly on the oxide-rich amorphous interfacial layer directly on the silicon substrate.

2. The method of claim 1, wherein the hydrocarbon has a general formula of $C_mH_n$, where m is in a range of from 1 to 120, and n is in a range of from 2 to 242.

3. The method of claim 2, wherein the gas stream further comprises one or more of carbon dioxide ($CO_2$), hydrogen ($H_2$), nitrogen ($N_2$), and argon (Ar).

4. The method of claim 3, wherein the gas stream comprises from 5% to 90% of the hydrocarbon.

5. The method of claim 1, wherein the oxide-rich amorphous interfacial layer directly on the substrate is maintained at a temperature of less than 600° C. during incubation.

6. The method of claim 1, wherein the diamond particles are maintained at a temperature in a range of from 100° C. to 750° C. during formation of the nanocrystalline diamond film.

7. The method of claim 1, wherein the silicon substrate is exposed to the first plasma at a temperature in a range of from 20° C. to 600° C.

8. The method of claim 1, wherein the silicon substrate is exposed to the first plasma at a distance of greater than 1 cm.

9. The method of claim 1, wherein when the oxide-rich amorphous interfacial layer directly on the silicon substrate is incubated with the gas stream, the gas stream is about 1 cm to 10 cm away from the top surface of the oxide-rich amorphous interfacial layer directly on the silicon substrate.

10. The method of claim 1, wherein when the diamond particles are exposed to the second plasma, the third plasma is less than 10 cm away from the top surface of the seeded substrate.

11. The method of claim 1, wherein the oxide-rich amorphous interfacial layer has a thickness of less than or equal to about 50 nm.

12. The method of claim 1, wherein the oxide-rich amorphous interfacial layer comprises about 5 to about 70 atomic percent of oxygen.

13. A method of forming a diamond film, the method comprising:

exposing a treated substrate to a gas stream to nucleate diamond particles on a top surface of the substrate, the substrate comprising an exposed amorphous oxide-rich layer, the gas stream comprising a hydrocarbon; and exposing the diamond particles to a plasma having a power greater than 50 W to form a nanocrystalline diamond film on the top surface of the substrate, wherein the substrate is not silicon.

14. The method of claim 13, wherein the hydrocarbon has a general formula of $C_mH_n$, where m is in a range of from 1 to 120, and n is in a range of from 2 to 242.

15. The method of claim 14, wherein the gas stream further comprises one or more of carbon dioxide ($CO_2$), hydrogen ($H_2$), nitrogen ($N_2$), and argon (Ar).

16. The method of claim 15, wherein the gas stream comprises from 5% to 90% of the hydrocarbon.

17. The method of claim 13, wherein the amorphous oxide-rich layer has a thickness of less than or equal to about 50 nm.

* * * * *